United States Patent
Palsulich et al.

(10) Patent No.: US 11,742,230 B2
(45) Date of Patent: Aug. 29, 2023

(54) CONTAMINANT DETECTION TOOLS INCLUDING NEBULIZER AND RELATED METHODS

(71) Applicant: Micron Technology, Inc., Boise, ID (US)

(72) Inventors: David Palsulich, Boise, ID (US); Nicholas A. Wieber, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/456,338

(22) Filed: Nov. 23, 2021

(65) Prior Publication Data
US 2022/0084858 A1 Mar. 17, 2022

Related U.S. Application Data

(62) Division of application No. 16/582,420, filed on Sep. 25, 2019, now Pat. No. 11,211,272.

(51) Int. Cl.
| | | |
|---|---|---|
| *H01L 21/67* | (2006.01) | |
| *H01L 21/02* | (2006.01) | |
| *H01J 49/10* | (2006.01) | |
| *H01L 21/66* | (2006.01) | |

(52) U.S. Cl.
CPC ...... *H01L 21/67288* (2013.01); *H01J 49/105* (2013.01); *H01L 21/0206* (2013.01); *H01L 21/02164* (2013.01); *H01L 21/02236* (2013.01); *H01L 22/12* (2013.01)

(58) Field of Classification Search
CPC .......... H01L 21/67288; H01L 21/0206; H01L 21/02164; H01L 21/02236; H01L 22/12; H01L 21/6708; H01L 22/30; H01J 49/105; G01N 1/32
See application file for complete search history.

(56) References Cited

U.S. PATENT DOCUMENTS

| | | |
|---|---|---|
| 6,200,387 B1 | 3/2001 | Ni |
| 6,541,401 B1 | 4/2003 | Herner et al. |
| 6,686,999 B2 | 2/2004 | Ketkar |
| 6,992,282 B2 | 1/2006 | Jacksier et al. |
| 7,002,144 B1 | 2/2006 | Palsulich et al. |
| 8,525,107 B2 | 9/2013 | Bandura et al. |
| 8,968,576 B2 | 3/2015 | Holland et al. |
| 9,117,759 B2 | 8/2015 | Sapra et al. |
| 10,036,496 B1 | 7/2018 | Wiederin |
| 10,151,727 B2 | 12/2018 | Kawabata et al. |
| 2006/0177987 A1 | 8/2006 | Bergman |

(Continued)

OTHER PUBLICATIONS

Agilent 7500/7700/7800/7900/8x00 Series ICP-MS Cross Reference Guide, Available Online at < www.savillex.com >, 4 pages.

(Continued)

*Primary Examiner* — John P. Dulka
(74) *Attorney, Agent, or Firm* — TraskBritt

(57) ABSTRACT

A method of contaminant detection comprises exposing a wafer comprising one or more contaminants to microdroplets of an oxidizer to form an oxide on a surface of the wafer, exposing the oxide to an etchant to remove the oxide and leave the one or more contaminants on the surface of the wafer, and determining a composition of the one or more contaminants. Additional methods and related tools are also disclosed.

22 Claims, 3 Drawing Sheets

(56) References Cited

U.S. PATENT DOCUMENTS

| | | |
|---|---|---|
| 2007/0227556 A1 | 10/2007 | Bergman |
| 2008/0087970 A1 | 4/2008 | Verhaverbeke |
| 2009/0217947 A1 | 9/2009 | Wiederin et al. |
| 2015/0273659 A1* | 10/2015 | Aono ................ B24B 37/34 134/103.2 |
| 2018/0012780 A1* | 1/2018 | Shinozaki .......... H01L 21/6715 |
| 2019/0172729 A1* | 6/2019 | Yost .................. H01L 22/34 |
| 2019/0172731 A1* | 6/2019 | Yost .................. H01L 21/6719 |

OTHER PUBLICATIONS

Meinhard, Plus Series Nebulizers, Elemental Scientific Glassblowing, 2 pages.
P.Maillot, Fully Automated VPD ICP-MS System, Rousset Technology Center STMicroectronics, (Oct. 2011), 57 pages.
Savillex, Savillex Technical Note, C-Flow PFA Microconcentric Nebulizer Range, 5 pages.
Smedt et al., "A Detailed Study on the Growth of Thin Oxide Layers on Silicon Using Ozonated Solutions," Journal of the Electrochemical Society, vol. 147, (2000), pp. 1124-1129.
Wang et al., "Analytical Techniques for Trace Elemental Analyses on Wafer Surfaces for Monitoring and Controlling Contamination," Balazs Analytical Laboratory, (2000), 9 pages.

* cited by examiner

CONTAMINANT DETECTION TOOLS INCLUDING NEBULIZER AND RELATED METHODS

CROSS-REFERENCE TO RELATED APPLICATION

This application is a divisional of U.S. patent application Ser. No. 16/582,420, filed Sep. 25, 2019, now U.S. Pat. No. 11,211,272, issued Dec. 28, 2021, the disclosure of which is hereby incorporated herein in its entirety by this reference.

TECHNICAL FIELD

Embodiments of the disclosure relate to the field of microelectronic device fabrication. More specifically, embodiments disclosed herein relate to contaminant detection tools and to related methods.

BACKGROUND

Fabrication of a microelectronic device includes forming the components of the microelectronic device, such as electrodes, transistors, capacitors, memory materials, and other components of the microelectronic device under clean conditions. For example, fabrication of microelectronic devices includes forming and patterning, dielectric materials, conductive materials, photoresist materials, among other materials. However, formation and patterning of such materials may leave residues and various contaminants in the microelectronic device fabrication tool that may be detrimental to the successful fabrication of the microelectronic device if exposed to such materials during other fabrication acts. As one example, metals used during formation of various electrically conductive components of the microelectronic device may undesirably remain in the fabrications tools used to form the metal-containing materials. Unfortunately, metals within the wafer, on surfaces of the wafer, and remaining in the microelectronic device fabrication tools may undesirably contaminate the microelectronic device during other fabrication acts, such as during formation of one or more electrically insulative materials.

In addition, during fabrication of the microelectronic device, the microelectronic device may be moved from one fabrication tool to another fabrication tool. However, moving the microelectronic device between various fabrication tools may expose the microelectronic device to various contaminants. In addition, the fabrication tools may include undesired contaminants therein, which may comprise, for example, one or more materials previously formed in the fabrication tool during use of the fabrication tool to fabricate another microelectronic device. Fabrication of components of the microelectronic device in the presence of one or more contaminants may result in the ultimate failure and/or reduced functionality of the microelectronic device.

Accordingly, it is generally desirable to remove contaminants from the microelectronic device and from the microelectronic device fabrication tools before beginning subsequent processing acts. For example, after forming and patterning a conductive material, such as titanium or titanium dioxide, it may be desirable to remove titanium from the fabrication tool prior to forming other materials, such as electrically insulative materials (e.g., silicon dioxide), that may otherwise become contaminated due to the presence of titanium in the fabrication tool.

Since contamination of the microelectronic devices may ultimately lead to failure of the microelectronic devices, successful fabrication of microelectronic devices includes monitoring the fabrication tools and the wafer on which the microelectronic devices are formed for one or more contaminants during various fabrication acts. Some methods of determining the presence of the one or more contaminants include total reflection x-ray fluorescence (TXRF), vapor phase decomposition total reflection x-ray fluorescence (VPD-TXRF), vapor phase decomposition inductively coupled plasma mass spectroscopy (VPD-ICP-MS), and synchrotron radiation total reflection x-ray fluorescence (SR-TXRF). Each method of detection may exhibit advantages and disadvantages relative to other methods of detection. For example, TXRF and VPD-TXRF are generally not suitable for detection of elements such as lithium, beryllium, and boron, and has difficulty detecting sodium, magnesium, and aluminum, among other elements. In addition to microelectronic device fabrication, used wafers may be reclaimed for reuse in another application. Detection of contaminants within a material, such as a microelectronic device fabrication wafer, a reclaimed wafer, a film, a test wafer, or another wafer may be desired.

DETAILED DESCRIPTION

Figure 1:
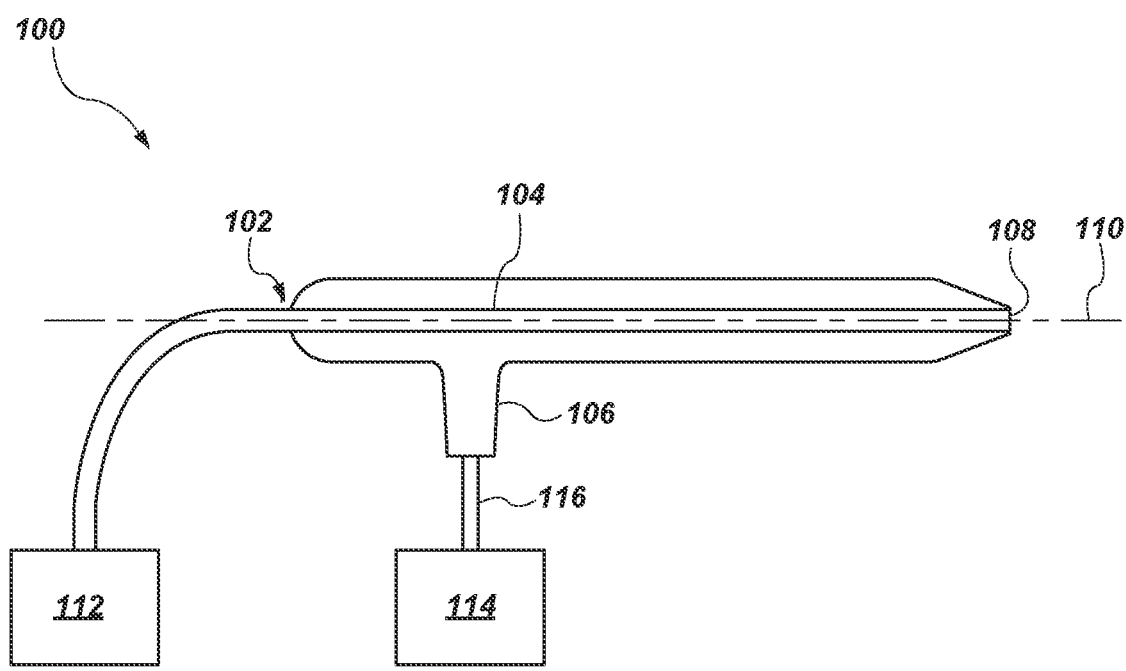
FIG. 1 is a simplified cross-sectional view of a nebulizer, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a method of forming an oxide on a surface of a wafer (e.g., a microelectronic device fabrication wafer, a test wafer, a reclaim wafer, a film of a wafer), a method of detecting one or more contaminants in or on the wafer or within a microelectronic device fabrication tool, or related systems for forming the oxide or detecting the one or more contaminants. The structures described below do not form complete microelectronic devices or integrated circuits. Only those process acts and structures necessary to understand the embodiments described herein are described in detail below.

Additional acts to form an oxide on surfaces of a wafer or microelectronic device or to detect one or more contaminants may be performed by conventional techniques.

Unless indicated otherwise below, materials described herein may be formed by conventional techniques including, but not limited to, spin coating, blanket coating, chemical vapor deposition (CVD), atomic layer deposition (ALD), plasma enhanced ALD (PEALD), physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "microdroplets" means and includes droplets of a material having a mean volume of less than about 1.0 microliter (µL). For example, a microdroplets may have a mean volume from about 0.01 µL to about 1.0 µL.

As used herein, the term "wafer" means and includes a structure including a semiconductor material, such as, for example, a silicon material, a gallium arsenide material, a III-V material (e.g., materials including one or more of aluminum, gallium, and indium, and one or more of nitrogen, phosphorus, arsenic, and antimony, such as gallium arsenide, indium phosphide, gallium phosphide, and gallium nitride), a II-VI material (e.g., materials including one or both of zinc and cadmium, and one or more of oxygen, sulfur, selenium, and tellurium, such as cadmium selenide, cadmium sulfide, cadmium telluride, zinc oxide, zinc selenide, zinc sulfide, and zinc telluride), or another material. The wafer may include a silicon-on-insulator (SOI) wafer, silicon-on-glass, an epitaxial wafer, a reclaimed wafer, a wafer coupon, a film (e.g., a surface of a wafer), a test wafer, or another type of wafer. In some embodiments, the wafer includes phosphorus (e.g., black phosphorus). In some embodiments, at least a portion of the wafer (e.g., a surface, such as an exposed surface, of the wafer) comprises a metal or a semimetal. For example, at least a portion of the wafer may include aluminum, titanium, vanadium, chromium, manganese, cobalt, nickel, zinc, gallium, zirconium, niobium, ruthenium, rhodium, palladium, cadmium, hafnium, tantalum, tungsten, osmium, iridium, or platinum.

According to embodiments described herein, a wafer (e.g., a silicon wafer used for the manufacture of microelectronic devices, a reclaimed wafer, a test wafer, a wafer coupon) or a microelectronic device fabrication tool (also referred to as a "fabrication tool" herein) used during the fabrication of microelectronic devices is analyzed for the presence of one or more contaminants. The one or more contaminants may be introduced to the wafer or the microelectronic device fabrication tool by exposure of the wafer and/or the fabrication tool through the ambient environment or exposure during one or more microelectronic device fabrication acts, such as during one or more of material etching, wet etching, dry etching, ion implantation, material deposition (e.g., ALD, CVD, PECVD, PEALD, LPCVD, another deposition method), annealing, or during other fabrication acts. A presence of the one or more contaminants in a fabrication tool may be determined by placing a wafer (e.g., a dummy wafer) in the fabrication tool and subsequently determining whether the wafer includes contaminants.

The one or more contaminants may be collected for analysis by vapor phase decomposition (VPD), such as by vapor phase decomposition-droplet collection. In some embodiments, at least a portion of a surface of the wafer including one or more contaminants is oxidized. The surface of the wafer may be oxidized by exposing the surface of the wafer to one or more oxidizers. The one or more oxidizers may be in the form of a mist, such as an aerosol, which may include microdroplets of the one or more oxidizers. The aerosol may be formed in a nebulizer to generate the microdroplets. In some embodiments, the one or more oxidizers may be fed to the nebulizer and mixed with one or more carrier gases to generate the aerosol. In some embodiments, the one or more oxidizers comprises hydrogen peroxide. Exposing the surface of the wafer to the oxidizer forms an oxide (e.g., silicon dioxide) on the surface of the wafer. A thickness of the oxide may be controlled by introducing the oxidizer to the wafer in the form of microdroplets via the nebulizer and by adjusting the concentration of the oxidizer. After forming the oxide on the surface of the wafer, the wafer may be exposed to an etchant formulated and configured to remove the oxide from the surface of the wafer. In some embodiments, the etchant removes the oxide without substantially removing the one or more contaminants from the wafer. After removing the oxide, the wafer may be exposed to a scanning solution formulated to interact with (e.g., dissolve) the one or more contaminants. The scanning solution may be scanned over surfaces of the wafer and subsequently collected from the surface of the wafer. The scanning solution including the one or more contaminants may be analyzed to determine a presence of the one or more analytes. For example, the scanning solution may be analyzed in an inductively coupled plasma mass spectroscopy (ICP-MS) tool. Accordingly, one or more of a presence, a concentration, and a composition of the one or more contaminants in the wafer or in the fabrication tool may be determined.

Forming the oxide on the surface of the wafer with the aerosol generated by the nebulizer may be advantageous compared to conventional methods of forming an oxide. For example, forming the oxide with the aerosol may reduce the likelihood that contaminants present on the surface of the wafer are washed away, as may be the case when the surface of the wafer is immersed in a liquid to form the oxide. According to embodiments described herein, such contaminants may be measured and detected since they are not washed away. In addition, the nebulizer facilitates forming the oxide with a relatively small volume of the oxidizer. Since the wafer is oxidized with a relatively small volume of the oxidizer (relative to conventional methods of immersing or spraying the wafer), relatively smaller volumes of potential contaminants are introduced to the wafer through the oxidizer. In other words, the small volume of the oxidizer reduces the likelihood of contaminating the wafer with contaminants present in the oxidizer. Further, the method of oxidizing with the microdroplets is relatively faster than conventional methods of forming the oxide since the wafer surface does not need to be dried, as is the case in conventional oxide formation by immersion or spraying of the wafer with a liquid oxidizer. In some embodiments, the oxide is formed in less than about two minutes after exposure to the microdroplets of the oxidizer. Forming the oxide with the microdroplets of the oxidizer formed via the nebulizer may reduce safety concerns often encountered in alternative methods of forming the oxide that include bubbling ozone through a liquid medium and exposing the wafer to ozone. In addition, the oxidizer may be more stable than ozone, which generally decomposes in minutes while the oxidizers used herein may be stable for more than several weeks or months. Further, ozone is formed via a catalyzed reaction that may result in introduction of metallic contamination that would be detected during the analysis of scanning solution, resulting in an incorrect detection of contaminants on the wafer. According to embodiments described herein, forming the oxide with the nebulizer reduces contaminants that would otherwise be introduced to the wafer and increases the accuracy of detection of the contaminants.

FIG. 1 is a simplified cross-sectional view of a nebulizer 100, in accordance with embodiments of the disclosure. The nebulizer 100 includes a liquid input port 102 including a capillary tube 104 (also referred to as a "capillary") extending therethrough, a gas inlet port 106 extending substantially perpendicular to the liquid input port 102, and a nozzle 108. The liquid input port 102 and the capillary tube 104 may extend substantially along a longitudinal axis 110 of the nebulizer 100. The gas inlet port 106 may extend substantially perpendicularly to the longitudinal axis 110.

The liquid input port 102 may be configured to receive a liquid to be aspirated by the nebulizer 100. The capillary tube 104 may be in fluid communication with a liquid 112, which may comprise an oxidizer, as will be described herein. The nebulizer 100 may generate an aerosol comprising microdroplets of the liquid 112. The liquid 112 may include, for example, one or more of hydrogen peroxide, a mixture of hydrogen peroxide, water, and ammonia (which may be referred to as a "SC1" or a "standard clean" solution), nitric acid, sulfuric acid, perchloric acid ($HClO_4$), hydrofluoric acid, or a mixture of one or both of ozone and hydrogen peroxide with one or more acids selected from the group consisting of nitric acid, sulfuric acid, perchloric acid, and hydrofluoric acid. In some embodiments, the liquid 112 comprises hydrogen peroxide.

In embodiments in which the liquid 112 comprises hydrogen peroxide, the hydrogen peroxide may be present in the liquid 112 at a weight percent within a range extending from about 1 weight percent to about 50 weight percent, such as from about 1 weight percent to about 5 weight percent, from about 5 weight percent to about 10 weight percent, from about 10 weight percent to about 15 weight percent, from about 15 weight percent to about 20 weight percent, from about 20 weight percent to about 25 weight percent, from about 25 weight percent to about 30 weight percent, from about 30 weight percent to about 35 weight percent, from about 35 weight percent to about 40 weight percent, or from about 40 weight percent to about 50 weight percent. In some embodiments, the liquid 112 comprises from about 25 weight percent to about 35 weight percent hydrogen peroxide, such as about 30 weight percent hydrogen peroxide. In some embodiments, the liquid 112 comprises from about 1 weight percent to about 35 weight percent hydrogen peroxide.

The capillary tube 104 may extend through the liquid input port 102 and along the longitudinal axis 110 to the nozzle 108. At the nozzle 108, the liquid 112 in the capillary tube 104 is discharged from the capillary tube 104 and mixed with a carrier gas 114 from the gas inlet port 106. A diameter of the capillary tube 104 may be within a range from about 0.10 millimeter (mm) to about 5.0 mm, such as from about 0.10 mm to about 0.15 mm, from about 0.15 mm to about 0.20 mm, from about 0.20 mm to about 0.25 mm, from about 0.25 mm to about 0.30 mm, from about 0.30 mm to about 0.40 mm, from about 0.40 mm to about 0.50 mm, from about 0.50 mm to about 0.60 mm, from about 0.60 mm to about 0.80 mm, from about 0.80 mm to about 1.0 mm, from about 1.0 mm to about 2.0 mm, from about 2.0 mm to about 3.0 mm, from about 3.0 mm to about 4.0 mm, or from about 4.0 mm to about 5.0 mm. In some embodiments, the diameter of the capillary tube 104 is within a range from about 0.15 mm to about 0.25 mm.

The capillary tube 104 may be configured to provide the liquid 112 to the liquid input port 102 at a flow rate within a range extending from about 10 µL per minute (µL/min) to about 400 µL/min, such as from about 10 µL/min to about 20 µL/min, from about 20 µL/min to about 30 µL/min, from about 30 µL/min to about 40 µL/min, from about 40 µL/min to about 50 µL/min, from about 50 µL/min to about 75 µL/min, from about 75 µL/min to about 100 µL/min, from about 100 µL/min to about 150 µL/min, from about 150 µL/min to about 200 µL/min, from about 200 µL/min to about 300 µL/min, or from about 300 µL/min to about 400 µL/min. In some embodiments, the capillary tube 104 provides the liquid at a flow rate within a range from about 10 µL/min to about 50 µL/min, such as from about 10 µL/min to about 30 µL/min or from about 30 µL/min to about 50 µL/min.

The gas inlet port 106 may extend substantially perpendicular to the longitudinal axis 110 of the nebulizer 100. The gas inlet port 106 may be in fluid communication with the carrier gas 114 used to nebulize the liquid 112. The carrier gas 114 may comprise any material as that does not substantially introduce any contaminants to the aerosol. The carrier gas 114 is coupled to the gas inlet port 106 via a carrier gas line 116. The carrier gas 114 may comprise one or more of argon, nitrogen, oxygen, a mixture of nitrogen and oxygen (e.g., ambient air), carbon dioxide, nitrous oxide, ozone, helium, or steam (which may be heated prior to entry through the gas inlet port 106). In some embodiments, the carrier gas 114 comprises argon or nitrogen. In use and operation, the carrier gas 114 mixes with the liquid 112 proximate the nozzle 108 to aspirate the liquid 112 and generate droplets (e.g., microdroplets) of the liquid 112. The droplets of the liquid 112 exit the nebulizer 100 through the nozzle 108 as an aerosol.

The carrier gas 114 may be provided to the gas inlet port 106 at a pressure within a range from about 207 kilopascals (kPa) (about 30 pounds per square in gauge (psig)) to about 689 kPa (about 100 psig), such as from about 207 kPa to about 250 kPa, from about 250 kPa to about 300 kPa, from about 300 kPa to about 400 kPa, from about 400 kPa to about 500 kPa, from about 500 kPa to about 600 kPa, or from about 600 kPa to about 689 kPa.

An average volume of the droplets of the liquid 112 in the aerosol exiting the nebulizer 100 may be within a range from about 0.01 µL to about 1.0 µL, such as from about 0.01 µL to about 0.02 µL, from about 0.02 µL to about 0.04 µL, from about 0.04 µL to about 0.06 µL, from about 0.06 µL to about 0.08 µL, from about 0.08 µL to about 0.10 µL, from about 0.10 µL to about 0.20 µL, from about 0.20 µL to about 0.30 µL, from about 0.30 µL to about 0.40 µL, from about 0.40 µL to about 0.60 µL, from about 0.60 µL to about 0.80 µL, or from about 0.80 µL to about 1.0 µL. However, the disclosure is not so limited and the average volume of the droplets may be different than those described.

The nebulizer 100 may comprise one or more of a fluoropolymer (e.g., perfluoroalkoxy alkane (PFA), polytetrafluoroethylene (PTFE), fluorinated ethylene propylene (FEP), perfluoro methyl alkoxy (MFA)), glass (borosilicate glass, quartz), and another inert material. In some embodiments, the nebulizer 100 includes a hydrophobic material that may facilitate reduction or prevention of droplet breaking. In some embodiments, the nebulizer 100 comprises PFA, such as Teflon™, commercially available from DuPont of Midland, Mich.

In use and operation, a desired flow rate of the liquid 112 is provided to the nozzle 108 through the capillary tube 104. The carrier gas 114 is provided through the carrier gas inlet port 106 and travels through the nebulizer 100 to the nozzle 108 where the carrier gas 114 is mixed with the liquid 112. The carrier gas 114 flows around the capillary tube 104 forming an annular gas stream around the end of the capillary tube 104 proximate the nozzle 108. As the liquid 112 exits the capillary tube 104, the carrier gas 114 shears the liquid 112 and generates the aerosol comprising the droplets having a desired droplet size distribution. At least a portion of the droplets are carried through the nozzle 108, which may be configured to direct the droplets to one or more surfaces of a wafer, as will be described herein. In some embodiments, the nebulizer 100 may include a drain configured to remove any droplets that may condense on internal walls of the nebulizer 100 to substantially reduce or prevent exit of the condensed droplets of the liquid through the nozzle 108 and onto a surface of a material to which the aerosol is directed.

Figure 2:
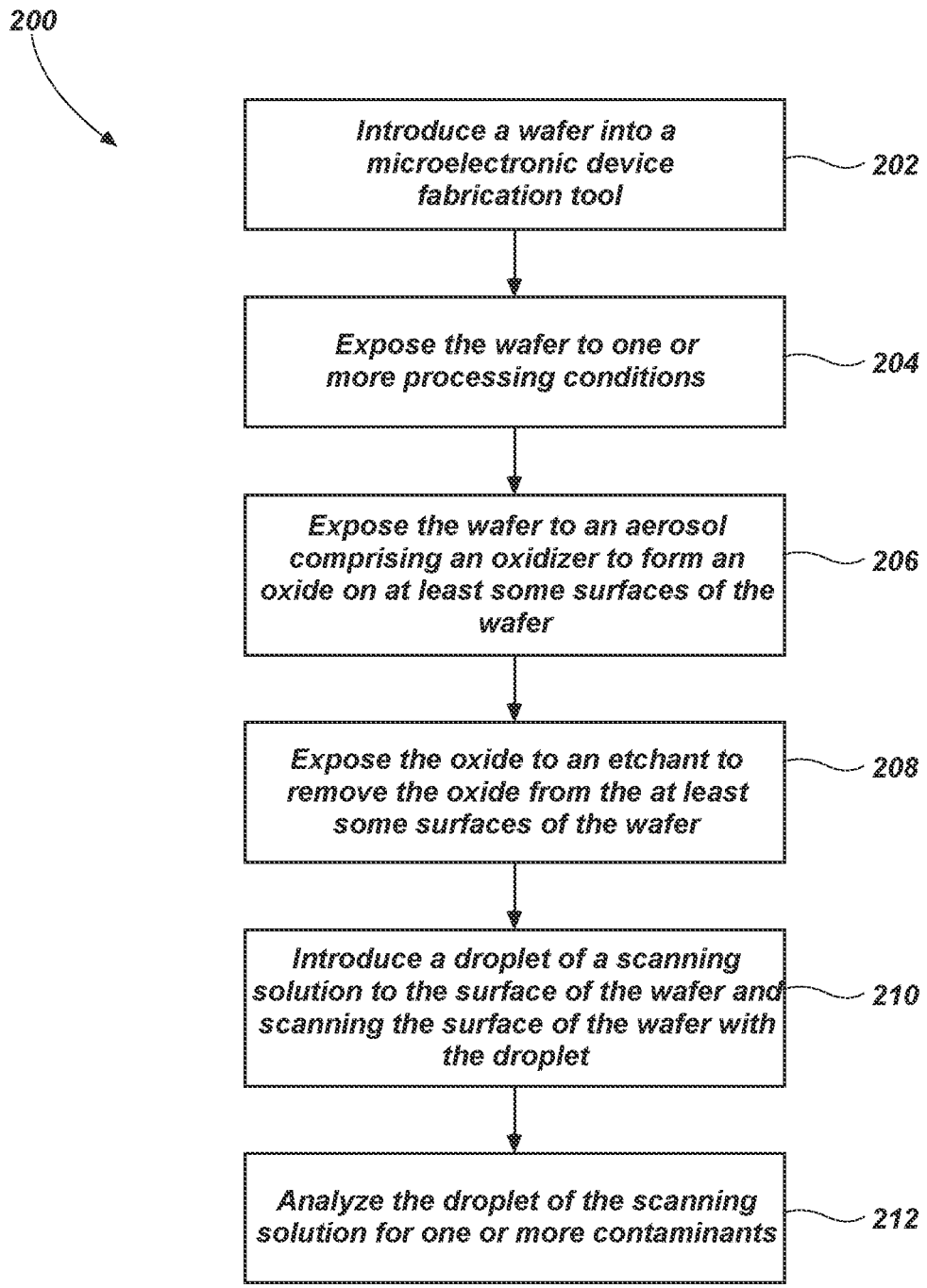
FIG. 2 is a simplified flow diagram of a method of detecting one or more contaminants in one or more of a microelectronic device fabrication tool and a wafer used to fabricate the microelectronic device, in accordance with embodiments of the disclosure.

FIG. 2 is a simplified flow diagram of a method 200 of detecting one or more contaminants in one or more of a microelectronic device fabrication tool and a wafer (e.g., a wafer used to fabricate the microelectronic device, a reclaim wafer, a test wafer, a film), in accordance with embodiments of the disclosure. The method 200 may include act 202 including introducing a wafer into a microelectronic device fabrication tool; act 204 including exposing the wafer to one or more processing conditions; act 206 including exposing the wafer to an aerosol comprising an oxidizer to form an oxide on at least some surfaces of the wafer; act 208 including exposing the oxide to an etchant to remove the oxide from the at least some surfaces of the wafer; act 210 including introducing a droplet of a scanning solution to the surface of the wafer and scanning the surface of the wafer with the droplet; and act 212 including analyzing the droplet of the scanning solution for one or more contaminants.

Act 202 includes introducing a wafer into a microelectronic device fabrication tool. In some embodiments, the wafer comprises a semiconductor wafer, such as a silicon wafer used during the manufacture of microelectronic devices. The wafer may comprise a base material or a construction upon which additional materials are formed. The base material may be a semiconductor substrate, a base semiconductor layer on a supporting structure, a metal electrode, or a metal electrode on a semiconductor substrate having one or more layers, structures or regions formed thereon. The base material may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material may be doped or undoped. In some embodiments, the wafer comprises a silicon wafer, such as a bare silicon wafer (e.g., a dummy silicon wafer, which may also be referred to as a test wafer). In other embodiments, the wafer comprises a test wafer, a reclaimed wafer, a portion of a wafer (e.g., a wafer coupon), or a film.

The microelectronic device fabrication tool may comprise, for example, one or more of an etching tool (e.g., a wet etching tool, a dry etching tool (such as a reactive ion etching (RIE) tool)), a deposition tool (e.g., an ALD tool, a CVD tool, a PVD tool, a PECVD tool, a PEALD tool, LPCVD, another deposition tool), an ion implantation tool, a chemical mechanical planarization (CMP) tool, an annealing chamber, or another tool.

In some embodiments, the wafer is disposed in the fabrication tool. The fabrication tool may include one or more contaminants therein. For example, the fabrication tool may include materials from previous fabrication acts, such as one or more metals, nonmetals, or semimetals. Such materials may undesirably contaminate microelectronic devices placed into the fabrication tool during other fabrication acts. In some embodiments, the fabrication tool may include one or more materials (e.g., aluminum) on the walls thereof that may volatilize during various fabrication acts. As will be described herein, the wafer may be used to determine a presence of one or more contaminants within the fabrication tool and a composition of such contaminants.

Act 204 includes including exposing the wafer to one or more processing conditions in the fabrication tool. For example, the wafer may be exposed to conditions substantially similar to processing conditions to which other wafers to be placed in the fabrication tool may be exposed. In some embodiments, the wafer may be exposed to the fabrication tool under ambient conditions (e.g., ambient temperature and pressure). In other embodiments, the wafer is exposed to a temperature within a range from about 0° C. to about 400° C., such as from about 0° C. to about 20° C., from about 20° C. to about 50° C., from about 50° C. to about 100° C., from about 100° C. to about 200° C., from about 200° C. to about 300° C., or from about 300° C. to about 400° C. The wafer may be exposed to a pressure within a range from about 10 kPa to about 700 kPa, such as from about 10 kPa to about 50 kPa, from about 50 kPa to about 100 kPa, from about 100 kPa to about 200 kPa, from about 200 kPa to about 300 kPa, from about 300 kPa to about 400 kPa, from about 400 kPa to about 500 kPa, from about 500 kPa to about 600 kPa, or from about 600 kPa to about 700 kPa. In some embodiments, the wafer is exposed to one or more deposition conditions or one or more materials may be formed (e.g., deposited on the wafer) in the fabrication tool in the presence of the wafer.

Act 206 includes exposing the wafer to an aerosol comprising an oxidizer to form an oxide on at least some surfaces of the wafer. In some embodiments, the wafer is moved from the fabrication tool to another tool, where the wafer is exposed to the oxidizer. The oxidizer may comprise one or more of the materials described above with reference to the liquid 112. In some embodiments, the oxidizer comprises hydrogen peroxide, such as about 30 weight percent hydrogen peroxide. The oxide may comprise, for example, one or more of silicon dioxide, selenium oxide (e.g., selenium dioxide), tellurium oxide (e.g., tellurium dioxide), germanium oxide (germanium dioxide), a metal oxide, and oxides of phosphorus. In some embodiments, the oxide formed on the wafer comprises silicon dioxide. In other embodiments, the oxide comprises one or more of selenium oxide, tellurium oxide, germanium oxide, and silicon dioxide. In other embodiments, the oxide comprises a metal oxide (e.g., one or more of aluminum oxide, titanium oxide, vanadium oxide, chromium oxide, manganese oxide, cobalt oxide, nickel oxide, zinc oxide, gallium oxide, zirconium oxide, niobium oxide, ruthenium oxide, rhodium oxide, palladium oxide, cadmium oxide, hafnium oxide, tantalum oxide, tungsten oxide, osmium oxide, iridium oxide, or platinum oxide). In yet other embodiments, the oxide may include oxides of phosphorus.

Figure 3:
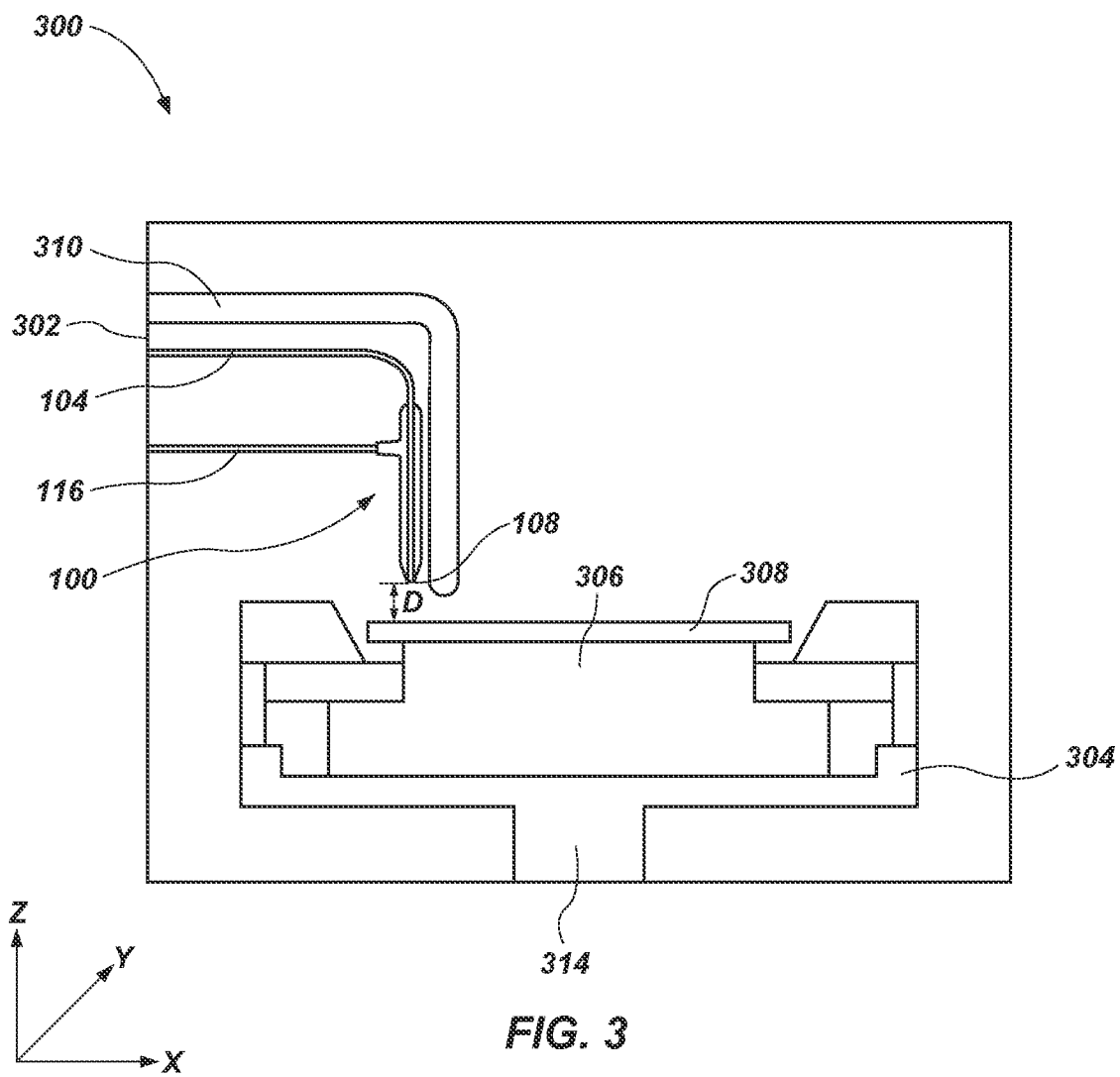
FIG. 3 is a simplified schematic of a tool comprising the nebulizer of FIG. 1 and configured to expose a wafer to an aerosol, in accordance with embodiments of the disclosure.

In accordance with embodiments of the disclosure, FIG. 3 illustrates a simplified schematic view of a tool 300 configured to effectuate act 206. As shown in FIG. 3, the tool 300 comprises the nebulizer 100 of FIG. 1 and is configured to expose a wafer 308 to the aerosol comprising the oxidizer. The tool 300 may also be referred to as a "wafer scanning tool." The tool 300 may include a chamber 302 including a pedestal 304, a chuck 306 (e.g., an electrostatic chuck) disposed on the pedestal 304, and the wafer 308 on the chuck 306. The pedestal 304, the chuck 306, or both may be configured to rotate along an axis 314 to rotate the wafer 308. The tool 300 may be configured to expose the wafer 308 to an oxidizer to form an oxide on the wafer 308.

The tool 300 may further include an arm 310 configured to move along a surface of the wafer 308 during use and operation of the tool 300. The arm 310 may be configured to move in one or more of the x-direction (left and right in the view of FIG. 3), the y-direction (into and out of the page in the view of FIG. 3), and the z-direction (up and down in the view of FIG. 3). In some embodiments, the arm 310 is configured to move in the radial direction (e.g., the x-direction and the y-direction).

The nebulizer 100 may be coupled to the arm 310, which may be configured to move the nebulizer 100 relative to surfaces of the wafer 308. Accordingly, the nebulizer 100 may be configured to move along a surface of the wafer 308, such as in the x-direction and the y-direction. In addition, the nebulizer 100 may be configured to move towards and away from the surface of the nebulizer 100 by moving in the z-direction to alter a distance D between the nozzle 108 (FIG. 1) and the surface of the wafer 308.

The nebulizer 100 may be coupled or configured to be coupled to a carrier gas, such as any of the carrier gases 114 described above with reference to FIG. 1. The nebulizer 100 may also be coupled to the liquid 112 (FIG. 1). The composition of the liquid 112 may be selected based on the properties of the wafer 308. For example, in some embodiments, forming the oxide on surfaces of the wafer 308 using one or more of the liquids 112 described above may convert hydrophilic surfaces of the wafer 308 to hydrophobic surfaces responsive to exposure to the aerosol comprising the oxidizer. In some embodiments, exposure of the wafer 308 to the oxidizer may reduce a pH of the surface of the wafer 308 and change the surface of the wafer 308 to exhibit hydrophobic properties. As will be described herein, a surface exhibiting hydrophobic properties may facilitate improved scanning of the wafer 308.

A distance D between the nozzle 108 (FIG. 1) and the surface of the wafer 308 may be within a range from about 5 mm to about 150 mm, such as from about 5 mm to about 10 mm, from about 10 mm to about 20 mm, from about 20 mm to about 30 mm, from about 30 mm to about 40 mm, from about 40 mm to about 50 mm, from about 50 mm to about 75 mm, from about 75 mm to about 100 mm, from about 100 mm to about 125 mm, or from about 125 mm to about 150 mm. However, the disclosure is not so limited and the distance D may be different than those described.

In use and operation, the nebulizer 100 generates an aerosol comprising microdroplets of the liquid 112, as described above with reference to FIG. 1. The nebulizer 100 may direct the aerosol to one or more portions of the wafer 308 to oxidize the one or more portions of the wafer 308. The tool 300 may be configured to expose the wafer 308 to the liquid 112 at a rate within a range from about 0.1 μL of the oxidizer per centimeter squared ($cm^2$) of the wafer 308 ($\mu L/cm^2$) to about 2.0 $\mu L/cm^2$, such as from about 0.1 $\mu L/cm^2$ to about 0.2 $\mu L/cm^2$, from about 0.2 $\mu L/cm^2$ to about 0.3 $\mu L/cm^2$, from about 0.3 $\mu L/cm^2$ to about 0.4 $\mu L/cm^2$, from about 0.4 $\mu L/cm^2$ to about 0.5 $\mu L/cm^2$, from about 0.5 $\mu L/cm^2$ to about 0.6 $\mu L/cm^2$, from about 0.6 $\mu L/cm^2$ to about 0.8 $\mu L/cm^2$, from about 0.8 $\mu L/cm^2$ to about 1.0 $\mu L/cm^2$, from about 1.0 $\mu L/cm^2$ to about 1.5 $\mu L/cm^2$, or from about 1.5 $\mu L/cm^2$ to about 2.0 $\mu L/cm^2$. However, the disclosure is not so limited and the liquid 112 may be provided at a different rate than those described.

In some embodiments, the wafer 308 is rotated along the axis 314 at a desired rate while the aerosol is directed toward the wafer 308. The arm 310 may move in the radial direction to distribute the aerosol on desired radial portions of the wafer 308 as the wafer 308 is rotated. In some embodiments, substantially all of the wafer 308 is exposed to the aerosol by moving the arm 310 in the radial direction concurrently with rotation of the wafer 308. In other embodiments, only a desired portion of the surface of the wafer 308 is contacted with the aerosol to form the oxide only at the respective portions of the wafer 308 contacted by the aerosol. By way of nonlimiting example, in some embodiments, the arm 310 is moved to desired radial distances from the center of the wafer 308 while the wafer 308 is rotated to expose annular portions of the wafer 308 located at desired radial distances from the center to the oxidizer. In other embodiments, the wafer 308 may not be rotated and desired portions of the wafer 308 are exposed to the aerosol by moving the arm 310 to form an oxide at only the desired portions of the wafer 308.

Exposing the wafer 308 to the oxidizer in the form of an aerosol may form an oxide on the wafer 308. In some embodiments, the oxide comprises silicon dioxide. A thickness of the oxide may be within a range from about 1 angstrom (Å) to about 30 Å, such as from about 1 Å to about 5 Å, from about 5 Å to about 7 Å, from about 7 Å to about 9 Å, from about 9 Å to about 11 Å, from about 11 Å to about 15 Å, from about 15 Å to about 20 Å, from about 20 Å to about 25 Å, or from about 25 Å to about 30 Å. In some embodiments, the thickness of the oxide is within a range of from about 1 Å to about 25 Å. In some embodiments, the thickness of the oxide is within a range of from about 6 Å to about 10 Å, such as from about 7 Å to about 9 Å. A thickness of the oxide may depend, at least in part, on the composition and concentration of the oxidizer within the aerosol. For example, in some embodiments, reducing the concentration of the oxidizer in the aerosol may reduce a thickness of the oxide relative to embodiments wherein the concentration of the oxidizer is increased.

A temperature of the tool 300, the wafer 308, and the aerosol may be within a range from about 0° C. to about 50° C., such as from about 0° C. to about 15° C., from about 15° C. to about 20° C., from about 20° C. to about 25° C., from about 25° C. to about 30° C., from about 30° C. to about 40° C., or from about 40° C. to about 50° C. In some embodiments, the temperature of the tool 300, the wafer 308, and the aerosol is within a range from about 15° C. to about 20° C.

Exposing the wafer 308 to the aerosol using the tool 300 may facilitate exposing the wafer 308 to the liquid 112 in a substantially uniform manner to form a substantially uniform oxide on surfaces of the wafer 308. In addition using the nebulizer 100 and the aerosol may reduce a likelihood of introducing contaminants to the wafer 308 via the oxidizer. For example, in some embodiments, an entire surface of the wafer 308 may exposed to the aerosol and oxidizer with less than about 1.0 mL of the oxidizer. By way of comparison, conventional methods of forming the oxide include, for example, dipping the wafer 308 in a bath comprising the oxidizer. However, such methods expose the wafer 308 to contaminants that are present in the oxidizer. In addition, exposing the wafer 308 to the relatively smaller volume of the oxidizer reduces a likelihood that the oxidizer will wash surface features of the wafer 308 away or remove or relocate contaminants from the surfaces of the wafer 308 to other locations. Further, forming the oxide with the aerosol may form the oxide to have the same thickness as a thickness of oxides formed by dipping or spraying the wafer 308 in a liquid oxidizer.

In some embodiments, forming the oxide with an aerosol may facilitate forming the oxide on only a portion (e.g., less than all) of surfaces of the wafer 308. In other words, since the oxide is formed with the aerosol, rather than by immersing the wafer 308 in a liquid oxidizer or spraying a liquid oxidizer on the wafer 308, the oxide may be formed at only desired locations of the wafer 308. By way of comparison, dipping the wafer 308 in a liquid bath comprising the oxidizer may oxidize the entire surface of the wafer 308 and may also oxidize front surfaces of the wafer 308 and back surfaces of the wafer 308.

Referring again to FIG. 2, act 208 may include exposing the oxide to an etchant to remove the oxide from the at least some surfaces of the wafer 308. In some embodiments, act 208 comprises performing vapor phase decomposition (VPD) to remove the oxide. The etchant may be formulated to remove the oxide without substantially removing the underlying portions of the wafer 308, such as silicon underlying the oxide. In some embodiments, the wafer 308 may be moved from the tool 300 to another tool to expose the wafer 308 to the etchant. In some embodiments, the contaminants present within the silicon of the wafer 308 are exposed and made available to collection and analysis responsive to exposure of the wafer 308 to the etchant.

The etchant may comprise, for example, one or more of hydrogen fluoride (HF) gas (also referred to as hydrofluoric acid vapor), hydrochloric acid, citric acid, acetic acid, sulfamic acid ($H_3NSO_3$), nitric acid ($HNO_3$) or another acid. In some embodiments, the etchant comprises hydrogen fluoride vapor. The hydrogen fluoride may react with the silicon dioxide to form one or more of silicon tetrafluoride ($SiF_4$) gas, sulfur hexafluorise ($SiF_6$) gas, or fluorosilicic acid ($H_2SiF_6$). In some embodiments, the etchant removes substantially all of the oxide from the surface of the wafer 308 while any contaminants that were present in the oxide and/or the silicon remain on the surface of the wafer 308. In some embodiments, the surface of the wafer 308 may become hydrophobic responsive to exposure to the etchant.

Act 210 includes introducing a droplet of a scanning solution to the surface of the wafer 308 and scanning the surface of the wafer 308 with the droplet. As used herein, "scanning" the wafer 308 with the droplet means and includes moving the droplet across surfaces of the wafer 308 to contact the surfaces with the scanning solution. The scanning solution may dissolve at least one contaminant present on the surface of the wafer 308. In some embodiments, the droplet is moved along substantially all surfaces of the wafer 308. In some such embodiments, the arm 310 may be located above with droplet and the wafer 308 may be rotated as the arm 310 is moved in the radial direction. In some embodiments, the surface of the wafer 308 may exhibit hydrophilic properties and may generally repel the droplet, which may comprise a hydrophilic material. As the arm 310 moves in the radial direction, the droplet may remain under the arm 310 and move in the radial direction along the same path as the arm 310. In some embodiments, the droplet remains under the arm 310 due to a hydrophobicity of the surface of the wafer 308, however the disclosure is not so limited. In other embodiments, the wafer 308 may be scanned manually. In some such embodiments, rather than rotating the wafer 308, the wafer 308 is tilted back and forth such that a major surface of the wafer 308 is located at an angle with respect to the Earth's gravitation field to move the droplet along the surface of the wafer 308.

In some embodiments, different sectors of the wafer 308 are scanned with the droplet. In some such embodiments, a first liquid droplet is disposed on the surface of the wafer 308 and contacts surfaces of the wafer 308 within particular radial distances from the center of the wafer 308. For example, the arm 310 may be moved from the center of the wafer 308 to a first radial distance from the center to contact portions of the wafer 308 between the center and the first radial distance with the first liquid droplet. Thereafter, the first liquid droplet may be collected for analysis, as will be described with reference to act 212. A second liquid droplet may be disposed on the surface of the wafer 308 between the first radial distance and a second radial distance located farther from the center of the wafer 308 than the first radial distance. The arm 310 may be moved between the first radial distance and the second radial distance as the wafer 308 is rotated to contact surfaces of the wafer 308 between the first radial distance and the second radial distance with the second liquid droplet. Thereafter, the second liquid droplet may be collected for analysis, as will be described with reference to act 212. The process may be repeated for different radial segments of the wafer 308 to contact different annular portions of the wafer 308 with different droplets, which may be analyzed to obtain a contamination map of the wafer 308.

The scanning solution may comprise one or more of hydrofluoric acid, nitric acid, hydrochloric acid, sulfuric acid, hydrogen peroxide, aqua regia (a mixture of nitric acid and hydrochloric acid), a mixture of hydrofluoric acid and hydrogen peroxide, a mixture of nitric acid and hydrogen peroxide, a mixture of sulfuric acid and hydrogen peroxide, or a mixture of ammonium hydroxide, hydrogen peroxide, and water. The composition of the scanning solution may depend on, for example, the composition of the one or more contaminants to be determined. For example, if the wafer 308 is being tested for the presence of boron, the acid may comprise hydrofluoric acid, such as 1 weight percent hydrofluoric acid. Where the contaminant comprises gold, the acid may include aqua redial ($HNO_3$ and $HCl$). If the contaminant comprises tungsten, aluminum, or both, the scanning solution may include SC1.

The scanning solution including the one or more contaminants, may be collected into a sample vial for analysis. Act 212 includes analyzing the droplet of the scanning solution for one or more contaminants. In some embodiments, the scanning solution is removed from the surface of the wafer 308, such as with a pipette. The tool 300 may include an arm coupled to a pipette configured to remove the scanning solution from the wafer 308. The droplet is analyzed for one or more of the presence of one or more contaminants, the composition of the one or more contaminants, and the concentration of the one or more contaminants. In some embodiments, the arm comprising the pipette is in operable communication with an analysis tool for determining one or more properties of the droplet.

In some embodiments, the droplet of the scanning solution is introduced into an analysis tool for determining one or more properties of the droplet. For example, the droplet may be analyzed in an inductively coupled plasma-mass spectroscopy (ICP-MS) tool. The ICP-MS tool may couple an inductively coupled plasma ionization source to a mass spectrometer. In some embodiments, the droplet may be passed through a nebulizer to generate an aerosol. The aerosol may be injected into a high temperature atmospheric pressure plasma obtained by coupling a radio frequency (RF) energy into a flowing plasma stream. The flowing plasma may comprise, for example, an argon plasma. The microdroplets of the nebulized droplet are nebulized to be small enough and the sample is vaporized, atomized, and ionized as the aerosol flows through the argon plasma. The resulting plasma containing the ionized sample components is extracted into a vacuum where the ions are separated from neutral species and subjected to mass analysis. As one example, the ions are introduced to a mass spectrometer that is coupled to the inductively coupled plasma source. The mass spectrometer may separate the ions generated in the inductively coupled plasma based on their mass-to-charge ratio and direct them to a detector where they are measured and quantified.

Although act 212 has been described as including analyzing the droplet by means of an inductively coupled plasma mass-spectrometer, the disclosure is not so limited. In other embodiments, act 212 includes analyzing the droplet of the scanning solution by other methods of trace element analysis, such as atomic absorption spectrometry (AAS). In other embodiments, the droplet is dried on the surface of the wafer and the residue is analyzed by one or more of total reflection x-ray fluorescence (TXRF), synchrotron radiation total reflection x-ray fluorescence, or another method.

The method 200 and tool 300 may be used to detect one or more contaminants that may be present during various microelectronic device fabrication acts. Such contaminants may include, for example, lithium, beryllium, boron, sodium, magnesium, aluminum, phosphorus, sulfur, chlorine, potassium, calcium, scandium, titanium, vanadium, chromium, manganese, iron, cobalt, nickel, copper, zinc, gallium, germanium, arsenic, selenium, bromine, strontium, yttrium, zirconium, niobium, molybdenum, ruthenium, rhodium, palladium, silver, cadmium, indium, tin, antimony, tellurium, cesium, barium, hafnium, tantalum, tungsten, iridium, platinum, gold, thallium, lead, bismuth, lanthanum, cerium, praseodymium, samarium, gadolinium, and dysprosium.

Accordingly, in some embodiments, a method of contaminant detection comprises exposing a wafer comprising one or more contaminants to microdroplets of an oxidizer to form an oxide on a surface of the wafer, exposing the oxide to an etchant to remove the oxide and leave the one or more contaminants on the surface of the wafer, and determining a composition of the one or more contaminants.

Moreover, in some embodiments, a method of detecting contaminants comprises nebulizing an oxidizer to form an aerosol, exposing a wafer to the aerosol to form an oxide on surfaces of the wafer, exposing the oxide to an etchant to remove the oxide, contacting surfaces of the wafer with at least one droplet of a scanning solution to dissolve material in the at least one droplet, and analyzing the at least one droplet for the material.

Furthermore, in some embodiments, a contaminant detection tool comprises a chuck configured to receive a wafer, the chuck configured to angularly rotate, an arm configured to move with respect to a surface of the chuck; and a nebulizer coupled to the arm and in fluid communication with an oxidizer and a carrier gas, the nebulizer configured to generate an aerosol comprising microdroplets of the oxidizer.

In addition, in some embodiments, a method comprises placing a wafer on a wafer chuck of a tool comprising a nebulizer in fluid communication with an oxidizer and a carrier gas, forming an aerosol comprising microdroplets of the oxidizer and the carrier gas, and exposing surfaces of the wafer to the aerosol to form an oxide on the surfaces of the wafer.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A contaminant detection tool, comprising:
a chuck configured to receive a wafer, the chuck configured to angularly rotate;
an arm configured to move with respect to a surface of the chuck; and
a nebulizer coupled to the arm and in fluid communication with an oxidizer and a carrier gas, the nebulizer configured to generate an aerosol comprising microdroplets of the oxidizer, the nebulizer spaced from the wafer by a distance within a range of from about 5 mm to about 150 mm.

2. The contaminant detection tool of claim 1, wherein the oxidizer comprises hydrogen peroxide.

3. The contaminant detection tool of claim 1, further comprising an inductively coupled plasma-mass spectrometer coupled to the tool.

4. The contaminant detection tool of claim 1, wherein the nebulizer comprises fluoropolymer.

5. The contaminant detection tool of claim 1, wherein the oxidizer comprises from about 25 weight percent hydrogen peroxide to about 35 weight percent hydrogen peroxide.

6. The contaminant detection tool of claim 1, wherein the nebulizer comprises a capillary tube extending from a liquid inlet port to a nozzle, the capillary tube configured to facilitate flow of the oxidizer from the liquid inlet port to the nozzle.

7. The contaminant detection tool of claim 6, wherein the nebulizer comprises a gas inlet port extending substantially perpendicular to the liquid inlet port.

8. The contaminant detection tool of claim 6, wherein the capillary tube has a diameter within a range of from about 0.15 mm to about 0.25 mm.

9. The contaminant detection tool of claim 1, wherein the nebulizer is configured to provide the oxidizer at a flow rate within a range of from about 10 µL/min to about 50 µL/min.

10. The contaminant detection tool of claim 1, wherein the nebulizer is configured to generate the aerosol comprising microdroplets having an average volume within a range of from about 0.01 µL to about 1.0 µL.

11. The contaminant detection tool of claim 1, wherein the arm is configured to move in a radial direction and in a vertical direction.

12. A method of using a contaminant detection tool, the method comprising:
placing a wafer on a wafer chuck of a tool comprising a nebulizer in fluid communication with an oxidizer and a carrier gas;
forming an aerosol comprising microdroplets of the oxidizer and the carrier gas;
exposing surfaces of the wafer to the aerosol to form an oxide on the surfaces of the wafer; and
after forming the oxide, scanning the surfaces of the wafer with a scanning solution to determine a presence of one or more contaminants on the surfaces of the wafer.

13. The method of claim 12, further comprising rotating the wafer chuck while exposing the surfaces of the wafer to the aerosol.

14. The method of claim 12, wherein forming an aerosol comprising microdroplets of the oxidizer comprises forming an aerosol comprising microdroplets of hydrogen peroxide.

15. The method of claim 12, wherein forming an oxide on the surfaces of wafer comprises forming an oxide having a thickness within a range from about 1 Å to about 25 Å on the surfaces of the wafer.

16. The method of claim 12, wherein determining a presence of one or more contaminants on the surfaces of the wafer comprises determining a presence of one or more of boron, gold, tungsten, and aluminum on the surfaces of the wafer.

17. The method of claim 12, wherein exposing surfaces of the wafer to the aerosol to form an oxide on the surfaces of the wafer comprises forming silicon dioxide on the surfaces of the wafer.

18. The method of claim 12, wherein exposing surfaces of the wafer to the aerosol to form an oxide on the surfaces of the wafer comprises converting hydrophilic surfaces of the wafer to hydrophobic surfaces.

19. The method of claim 12, wherein exposing surfaces of the wafer to the aerosol to form an oxide on the surfaces of the wafer comprises reducing a pH of the surface of the wafer.

20. The method of claim 12, wherein exposing surfaces of the wafer to the aerosol to form an oxide on the surfaces of the wafer comprises exposing the surfaces of the wafer to from about 0.1 µL of the oxidizer to about 2.0 µL of the oxidizer per square centimeter of the wafer.

21. The method of claim 12, further comprising exposing the oxide to one or more etchants to remove the oxide from the surfaces of the wafer.

22. The method of claim 12, further comprising analyzing a droplet of the scanning solution for the one or more contaminants.

* * * * *